United States Patent [19]

Dietze

[11] 4,345,142

[45] Aug. 17, 1982

[54] DIRECTLY HEATABLE SEMICONDUCTOR TUBULAR BODIES

[75] Inventor: Wolfgang Dietze, Munich, Fed. Rep. of Germany

[73] Assignee: Siemens Aktiengesellschaft, Berlin & Munich, Fed. Rep. of Germany

[21] Appl. No.: 950,452

[22] Filed: Oct. 11, 1978

Related U.S. Application Data

[62] Division of Ser. No. 745,227, Nov. 26, 1976, abandoned.

[30] Foreign Application Priority Data

Dec. 3, 1975 [DE] Fed. Rep. of Germany ....... 2554399

[51] Int. Cl.³ .......................... F27B 5/14; H05B 3/10; H01C 1/14
[52] U.S. Cl. .................................. 219/390; 219/301; 219/553; 338/330; 338/334; 428/36
[58] Field of Search ................ 338/334, 330; 219/390, 219/553, 301; 428/36

[56] References Cited

U.S. PATENT DOCUMENTS

| | | | |
|---|---|---|---|
| 2,910,664 | 10/1959 | Lanning | 338/330 |
| 3,834,939 | 9/1974 | Beyer | 148/190 |
| 3,899,557 | 8/1975 | Dietze | 264/81 |
| 3,962,670 | 6/1976 | Dietze | 338/334 |
| 3,974,561 | 8/1976 | Schnöeller | 219/390 |
| 3,984,267 | 10/1976 | Craford | 427/85 |

*Primary Examiner*—William R. Dixon, Jr.
*Attorney, Agent, or Firm*—Hill, Van Santen, Steadman, Chiara & Simpson

[57] ABSTRACT

Directly heatable tubular semiconductor bodies are produced by pyrolytically depositing a continuous layer of silicon or silicon carbide from a thermally decomposable silicon compound onto a heated graphite mandrel, non-destructively removing the so-deposited tubular body from the mandrel, applying a dopant-containing lacquer or the like onto select outer surface portions of such tubular body and subjecting the so-coated tubular body to diffusion conditions sufficient to dope the select outer body portions of the body and render such body directly heatable via an applied electrical current.

2 Claims, 1 Drawing Figure

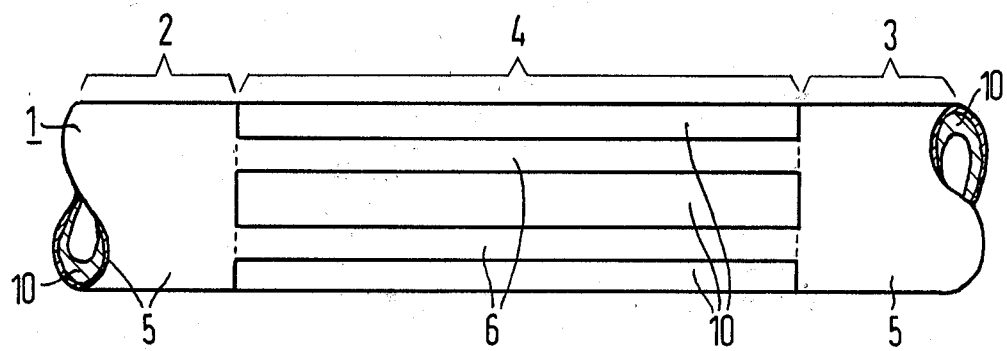

DIRECTLY HEATABLE SEMICONDUCTOR TUBULAR BODIES

This is a division of application Ser. No. 745,227, filed Nov. 26, 1976 now abandoned.

BACKGROUND OF THE INVENTION

1. Field of the Invention

The invention relates to directly heatable semiconductor bodies useful in diffusion doping processes and somewhat more particularly to directly heatable silicon or silicon carbide tubular bodies and methods of producing such bodies whereby select degrees of conductivity may be provided to select portions of the bodies.

2. Prior Art

Silicon and/or silicon carbide tubes or tubular bodies are especially useful in constructing tubular furnaces or the like, particularly in constructing diffusion furnaces wherein semiconductor components, such as wafers, are positioned within such tubular furnaces and subjected to select diffusion processes. However, silicon and/or silicon carbide tubes can only be heated by direct electrical current flow when the tube ends, which are operationally connected to a voltage source, have a sufficiently low resistance that the heat developed at the tube ends by the passages of current is relatively low while the remaining portion of the tube has sufficient resistivity to allow the desired heating of the tube via direct passage of an applied current.

A method for producing directly heatable silicon and/or silicon carbide tubes is disclosed and claimed by me in U.S. Pat. No. 3,899,557, which is essentially equivalent to German Offenlegungsschrift No. 22 53 411. In the so-disclosed process, two layers of, for example, silicon, are sequentially deposited on the outer surface of the heated carrier member so that the outermost layer of the so-deposited tubular body is doped while the innermost layer is composed of pure silicon. The two layers are pyrolytically deposited from thermally decomposable gaseous silicon compounds, the innermost layer from a silicon compound such as trichlorosilane admixed with hydrogen and the outermost layer from a somewhat similar silicon compound-hydrogen admixture which additionally includes a select amount of a gaseous dopant compound, such as phosphorous trichloride.

Such two layer silicon or silicon carbide tubes are substantially gas-impermeable and are well suited for diffusion processes throughout the entire semiconductor manufacturing sequence. Further, these tubes are extremely attractive for use in diffusion processes since the innermost layer of such tubes has a high degree of purity so that the various semiconductor components placed therein may contact such inner walls without any danger of contamination while the outermost layer of such tubes is sufficiently doped to allow direct passage of an electrical current therethrough so as to heat the overall tube to the desired diffusion temperature.

Nevertheless, a drawback of such two-layered tubes is that the doping thereof must be effected more or less simultaneously with the production process of the tubes and that it is only possible to produce a uniform doping over the entire circumferential surface of the tubes without any possibility of obtaining select doping of select surface areas of the tubes.

SUMMARY OF THE INVENTION

The invention provides a method of producing directly heatable semiconductor tubular bodies, preferably composed of silicon or silicon carbide and provides such directly heatable semiconductor bodies useful during diffusion processes in semiconductor technology.

In accordance with the principles of the invention, a semiconductor tubular body is formed by pyrolytically depositing silicon or silicon carbide onto the outer surface of a heated cylindrical mandrel, such as a hollow graphite carrier member, from a gas containing a thermally decomposable gaseous silicon compound, nondestructively removing the so-formed tubular body from the mandrel whereby the outer circumferential surface of such tubular semiconductor body comprises a layer which is at least partially doped so that an applied electrical current can directly pass through the doped surface area and heat the body to a desired temperature during a subsequent diffusion process or the like.

In a preferred embodiment of the invention, doping of the select outer circumferential surface areas of the tubular body is accomplished by applying a dopant-containing material to select outer surface areas of the body and subjecting the so-coated tubular body to diffusion conditions whereby the dopant diffuses into the underlying surface areas. In one embodiment of the invention, the doped layer is produced on the outer circumferential surface areas of the tubular body in such a manner that a relatively higher dopant concentration is present at the respective end portions of the tubular body than at the center portions of the tubular body. In another embodiment of the invention, the center portion of such tubular body is doped only along select geometric areas thereof, such as in spaced-apart strips which extend over the entire length of the tubular body between the respective end portions thereof. In a particularly preferred embodiment of the invention, the doped layer is applied in a controlled manner so that after diffusion, the resultant tube body exhibits a mean specific electrical resistance of not more than about 50 m ohm.cm at the respective end portions of such body and a mean specific electrical resistance of not more than about 500 m ohm.cm at the center portions thereof.

BRIEF DESCRIPTION OF THE DRAWING

The FIGURE comprises a fragmentary plan view, partially broken away and in cross-section, illustrating one embodiment of a directly heatable tubular body formed in accordance with the principles of the invention.

DESCRIPTION OF THE PREFERRED EMBODIMENTS

The invention provides directly heatable diffusion containers composed of a semiconductor material and a method of producing such containers.

In accordance with the principles of the invention, hollow tubular diffusion containers or bodies are produced by feeding a gas containing a thermally decomposable semiconductor compound onto a heated carrier surface so that such compound decomposes and deposits a semiconductor material as a continuous layer on the carrier surface. After a desired layer of thickness is achieved, the carrier surface is removed without destroying the newly formed tubular body and select outer surface areas of such body are then coated with a dopant-containing material. Thereafter, the so-coated tubular body is subjected to controlled diffusion conditions so that the dopant diffuses into the select surface areas of the body to provide the desired conductivity throughout the body.

In certain embodiments of the invention, the dopant-containing material is applied onto the outer circumferential surfaces of the tubular body in such a manner that the tube ends, which are to be operationally connected to a voltage source, contain a higher dopant concentration thereat than the center portions of such tubular body which are in electrical contact with the dopant-containing tube ends. In another embodiment of the invention, a select geometric pattern of the dopant-containing material is applied onto the outer circumferential surface of the tubular body so that such pattern extends along the entire length of the body, for example, as spaced-apart doped strips which extend along the center portion of the tube connected to one another via circumferentially continuous dopant layers at the respective ends of the tube.

In a particularly preferred exemplary embodiment of the invention, the applied dopant is controlled in such a manner that the resultant tubular body exhibits, at the respective ends thereof, an average specific electrical resistance of, at most, about 50 m ohm.cm and at the center portion between such ends, exhibits an average specific electrical resistance of, at most, about 500 m ohm.cm.

In accordance with the principles of the invention, the dopant-containing material includes a lacquer carrier which vaporizes without residue and is preferably selected from the group consisting of nitro-cellulose lacquers and photo-lacquers. Such lacquer carriers are readily admixed with select amounts of various dopant materials, such as trihalogenides of boron, phosphorous, arsenic or antimony as well as various boron hydrides. The lacquer carriers utilized in the practice of the invention generally vaporize at a temperature in the range of about 250° to 400° C. in an oxygen-argon atmosphere. The diffusion of a select dopant into the applied tubular body surface portions is effected at elevated temperatures of at least about 1200° C. over a relatively extended period of time of at least about 10 hours.

By proceeding in accordance with the principles of the invention, one may vary the dopant concentration in a diffusion container, either by applying dopant-containing materials having different dopant concentrations therein at different surface areas or by varying the diffusion parameters so that select portions of the applied dopants are either heated to different diffusion temperatures or are subjected to different diffusion time periods.

A further variation in the practice of the invention may be achieved by selecting various spacial arrangements for applying the dopant-containing material, for example, by applying different width or shape dopant-containing strips or by applying dopant-containing strips having different dopant concentrations therein from other strips applied onto a tubular body. In any of the variations of the invention, a higher dopant concentration is preferable at the tube end portions relative to the dopant concentration at the center portion of such tube.

The principles of the invention may be utilized both with acceptor dopants, such as boron, as well as with donor dopants, such as phosphorous.

Silocon tubular diffusion bodies produced in accordance with the invention have been examined as to the dopant distribution and crystal structure thereof in long-time studies at temperatures of 1300° C. and no changes worth mentioning occurred in regard to physical, chemical and/or mechanical properties of such bodies.

Referring now to the drawing, a silicon or silicon carbide tube 1 open at both ends thereof is partially illustrated. The tube or tubular body 1 is comprised of relatively pure semiconductor material (silicon or silicon carbide) along the inner surface 10 thereof and includes a relatively highly doped semiconductive layer 5 on the outer circumferential end surfaces thereof. As shown, respective end portions 2 and 3 of body 1 are provided with a circumferentially continuous doped layer 5 whereas the center portion 4 of body 1 is provided with spaced-apart doped strips 6. At least the inner surface 10 of body 1 is formed via pyrolytic gas deposition as described earlier while the outer doped layer is formed by applying a dopant-containing materal on the select outer circumferential surface portions of the pure semiconductor tubular body and then diffusing the dopant within the so-applied dopant-containing material into the outer surface portions of the body having dopant-containing material thereon. The geometric or stripe-shaped doped areas 6 are produced by the so-called paint-on technique, which may also be used to produce circumferentially continuous doped areas 5. As shown, individual doped strip areas 6 are separated from one another by undoped areas 10. For example, such spaced-apart doped areas may be produced by applying a commercially available photo-lacquer containing a phosphorous compound, exposing and developing such photo-lacquer to provide the desired pattern of dopant area, removing the remaining lacquer from the body by vaporizing such lacquer at about 300° C. in an oxygen-argon atmosphere and then diffusing the phosphorous into the underlying tube surface area at about 1200° C. over a time period of at least about 10 hours.

In a preferred exemplary embodiment of the invention, a photo-lacquer containing about 20% of phosphorous trichloride therein was applied to a silicon tubular body substantially in the pattern shown in the drawing. The tubular end portions were first coated so as to provide circumferentially continuous dopant layers, such as layers 5, and the resultant body was then subjected to diffusion conditions by maintaining it at 1250° C. for about 100 hours. The average specific electrical resistance of a so-produced doped area at the tubular body end portions was about 50 m ohm.cm. Thereafter, the center portion, such as 4, of this tubular body was provided with strips, such as 6, composed of the foregoing dopant-containing material and subjected to diffusion conditions by maintaining it at a temperature of about 1250° C. for about 20 hours. The average specific electrical resistance of the center portion (strips 6) of the resultant tubular body was about 150 m ohm.cm.

If desired, the dopant-containing material may be applied in a selected pattern to all surface areas to be doped prior to diffusion and the so-coated tube may be subjected to the select diffusion conditions simultaneously, for example, by providing separate heating means along the repective ends and center portions of the tubular body.

After the diffusion process is completed, the silicon or silicon carbide tubular body may be cleansed from any dopant residue by subjecting such tubular body to a relatively short etching period in concentrated hydrofluoric acid. Thereafter, current terminals may be attached to the respective end portions 2 and 3 and the resultant tubular body may be immediately utilized as a directly heatable container for encompassing semiconductor crystalline disks during diffusion of a dopant within such disks or in any other diffusion processes of semiconductor technology.

Although particular embodiments of the invention have been described and illustrated herein, it is recognized that modifications and variations may readily occur to those skilled in the art and consequently it is intended that the claims be interpreted to cover all such modifications and equivalents.

I claim as my invention:

1. A directly heatable seimconductor tubular body comprising:
   a cylindrical tube comprised of a relatively pure semiconductor material selected from a group consisting of silicon and silicon carbide, said tube having at least an inner surface composed of said relatively pure semiconductor material and having a pair of outer circumferential end portions and an outer circumferential center portion extending between respective ones of said pair of end portions;
   at least one layer of a dopant positioned on each one of said outer circumferential end portions; and
   a plurality of circumferentially spaced apart dopant layers on said outer circumferential center portion, each one of said spaced apart dopant layers being in contact with said dopant layer positioned on each of said outer circumferential end portions, the interrelationship between such respective dopant layers being such that an electric current applied to one outer circumferential end portion of said tube is conducted through such dopant layers to the other outer circumferential end portion of said tube for directly heating said body.

2. The directly heatable semiconductor tubular body of claim 1 further including a current terminal means directly attached to each one of said respective dopant layers positioned on each of said outer circumferential end portions of said tube.

* * * * *